(12) United States Patent
Bhora

(10) Patent No.: US 7,992,075 B2
(45) Date of Patent: Aug. 2, 2011

(54) ARRANGEMENTS FOR ENCODING AND DECODING DIGITAL DATA

(75) Inventor: Veerendra Bhora, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 1160 days.

(21) Appl. No.: 11/725,401

(22) Filed: Mar. 19, 2007

(65) Prior Publication Data

US 2008/0231479 A1    Sep. 25, 2008

(51) Int. Cl.
*H03M 13/03* (2006.01)
(52) U.S. Cl. .................................... 714/786
(58) Field of Classification Search ............ 714/746, 714/752, 786
See application file for complete search history.

(56) References Cited

U.S. PATENT DOCUMENTS

| | | | |
|---|---|---|---|
| 6,119,264 A * | 9/2000 | Berrou et al. | 714/786 |
| 6,192,501 B1 * | 2/2001 | Hladik et al. | 714/786 |
| 6,530,059 B1 * | 3/2003 | Crozier et al. | 714/786 |
| 7,478,314 B1 * | 1/2009 | Cheong et al. | 714/794 |

* cited by examiner

*Primary Examiner* — Shelly A Chase
(74) *Attorney, Agent, or Firm* — Schubert Law Group PLLC; Jeffrey S. Schubert

(57) ABSTRACT

A method for encoding data is disclosed. The method can include receiving a first bit segment (K−1 bits) from a bit stream, storing the first bit segment, initializing an encoder with the first bit segment, start encoding and transmitting from the $K^{th}$ bit to the end of the appended data stream, and appending the first bit segment (K−1 bits) to the end of the data stream. The disclose arrangements can be similar to tail-biting methods different in that the initial bits are utilized to initialize the encoded as opposed to the tail or last bit as provided by tailbiting methods.

18 Claims, 3 Drawing Sheets

ARRANGEMENTS FOR ENCODING AND DECODING DIGITAL DATA

FIELD

The present disclosure is related to the field of communications and more particularly to the field of encoding arrangements for digital communications.

BRIEF DESCRIPTION OF THE DRAWINGS

Aspects of the disclosure will become apparent upon reading the following detailed description and upon reference to the accompanying drawings in which, like references may indicate similar elements.

DETAILED DESCRIPTION OF EMBODIMENTS

Figure 1:
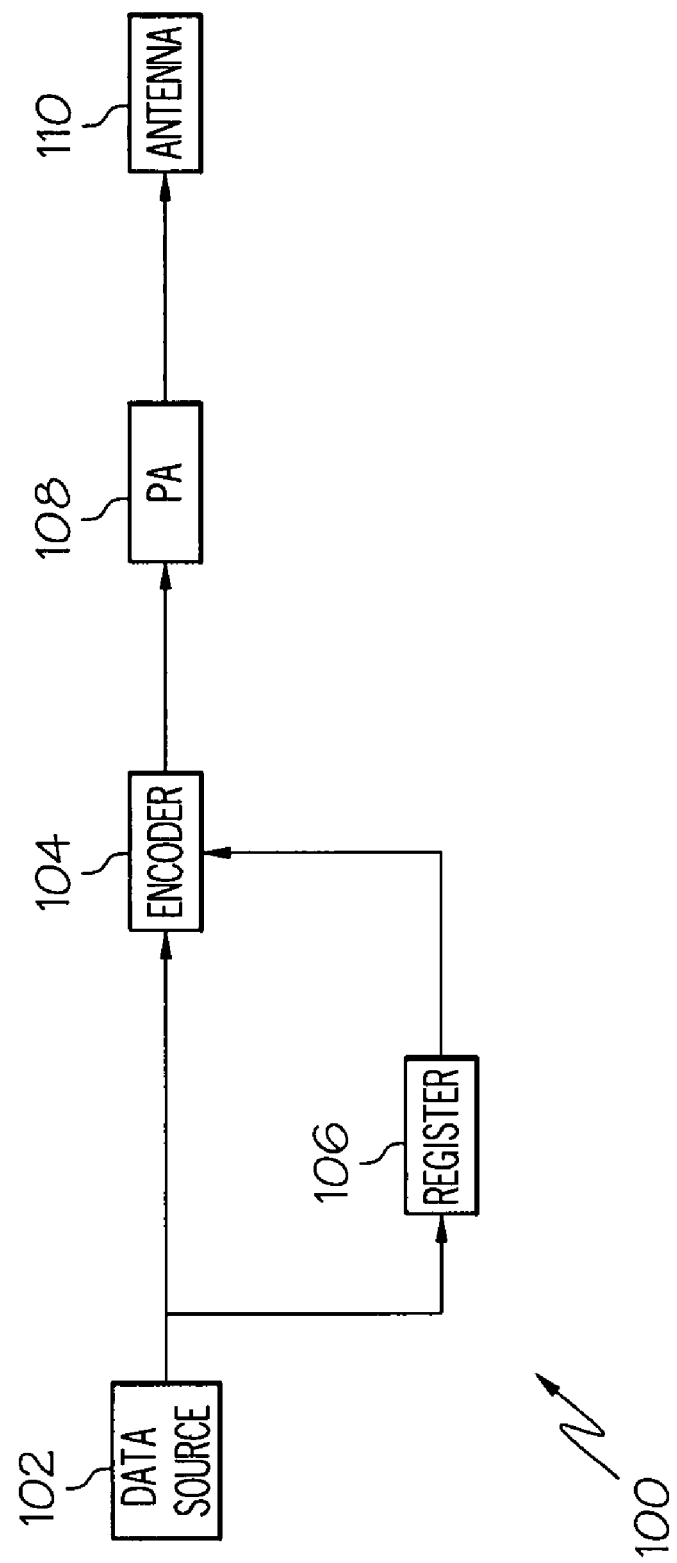
FIG. 1 depicts a block diagram of a data transmission system.

The following is a detailed description of embodiments of the disclosure depicted in the accompanying drawings. The embodiments are in such detail as to clearly communicate the disclosure. However, the amount of detail offered is not intended to limit the anticipated variations of embodiments; on the contrary, the intention is to cover all modifications, equivalents, and alternatives falling within the spirit and scope of the present disclosure as defined by the appended claims.

While specific embodiments will be described below with reference to particular configurations of hardware and/or software, those of skill in the art will realize that embodiments of the present disclosure may advantageously be implemented with other equivalent hardware and/or software systems. Aspects of the disclosure described herein may be stored or distributed on computer-readable media, including magnetic and optically readable and removable computer disks, as well as distributed electronically over the Internet or over other networks, including wireless networks. Data structures and transmission of data (including wireless transmission) particular to aspects of the disclosure are also encompassed within the scope of the disclosure.

Forward error correction has become a fundamental part of digital communications. One forward error correction technique commonly utilized in many wireless digital communications systems is convolution coding at the transmitting end, and "Viterbi" decoding at the receiving end. In such systems, information is transformed into binary data, the data is convolutionally encoded, the encoded data is passed through a noisy channel, the received channel symbols are quantizing, and Viterbi decoding is performed on the quantized channel symbols to recover the original binary data at the receiver. The purpose of forward error correction is to improve the capacity of a channel by adding some carefully designed redundant information to the data being transmitted through the channel and such information can be checked at the receiving end to perform forward error correction. Such encoding/decoding provides much improved reliability of a communication channel.

As stated above, the process of adding redundant information in the data stream is known as one form of channel coding. Convolutional coding and block coding are the two major forms of channel coding. Convolutional codes operate on serial data, one or a few bits at a time. Block codes can operate on relatively large (typically, up to a couple of hundred bytes) message blocks. There are a variety of useful convolutional and block codes, and a variety of algorithms for decoding the received coded information sequences to accurately recover the original data. Convolutional encoding with Viterbi decoding is a forward error correction technique that is particularly suited to a channel in which the transmitted signal is corrupted mainly by additive white Gaussian noise. One goal of encoding is to make the starting and ending states of the encoder the same. In some traditional arrangements zeros are added at the beginning or end of the transmission to place the encoder in a known state. This is undesirable because adding zeros or ones requires additional overhead and can create additional latency.

Tail biting is a well know technique that is commonly utilized in encoding for forward error correction schemes. Traditional tail-biting encoders, as the name suggests, take a bit segment at the end or tail of a block of data (the last few bits of the data block) and initializes the state of the encoder with this tail data before the data block is encoded and transmitted. Thus, this initialization with the tail sequence provides the "starting state" mentioned above, although the actual tail sequence may not be transmitted in the initial portion of the transmission, some indicator of its contents (encoded) can be transmitted such that the initial and last encoder states will match.

After the encoder is initialized, the encoder can begin to encode the bits in the block of data preparing them for transmission. Accordingly, it is part of a forward error correction technique to start and encoder in a particular state and returns the encoder to the known state after transmission of a data block. To do this the system can load the encoder with the same bit configuration initially or prior to a encoding and then load the encoder with the same data as the final bits to encode for transmission. This process is an integral part of forward error correction.

The traditional method for tail-bite type block encoding requires significant memory at the encoder because the entire block must be received and stored and not until the tail is received, can the encode/transmit process be started because the tail segment must be received and utilized to initialize the encoder. The time it takes to load the entire block of data into memory also introduces latency in the encoding process. Further, the larger the size of the message to be encoded, the larger the memory required, and the larger the message, the larger the latency. Having an undefined or variable latency can also create problems. Such, problem is defined in the Institute of Electrical and Electronic Engineers (IEEE) 802.16e, specification. More particularly the IEEE 802.16e specification defines systems which have messages with variable block sizes, must also accommodate a variable latency and illustrates that the largest possible block must be accommodated by a block-size memory on the silicon.

In accordance with the present disclosure, the initial bits or an initial bit segment in the block can be loaded initially into the decoder and the bit segment can again be loaded into the encoder at the end of the transmission similar to the tailbiting described above. One could refer to the disclosed idea as "headbiting" i.e. taking the head bit segment and placing it in the encoder initially, then transmitting the head bit segment at the end of the block transmission. Such a headbiting arrangement provides numerous improvements over traditional tail-biting methods including providing reduced hardware complexity and size for the encoder, a fixed latency, smaller memory requirements and only a minor addition to the complexity of a decoder on the receiving end.

Referring to FIG. 1 a data transmitter 100 is disclosed. The data transmitter can include a data source 102, an encoder 104, a register 106, a power amplifier 108 and an antenna 110. The register can be a shift register were bits are sequentially clocked into the register 106. The encoder 104 can have a length of K bits and can store the initial or first (K−1) bits of the message (or block) that is generated by the data source 102. The first K−1 bits or bit segment of the block are referred to herein as "head" bits as the last K−1 bits have traditionally been referred to as "tail" bits. In accordance with the present disclosure, the first bit segment, K−1 bits or the head bits can be utilized to initialize the state of the encoder 104. A copy of this bit segment or head bits can be stored in register 106. The encoder 104 can function similar to, or exactly like what has been traditionally referred to as a tail-biting encoder—starting from bits after the head-bits. Then the head bits from register 106 can be clocked into the encoder at the end of the bit sequence from the data source 102. The register 106 can have fixed length of K however this feature should not be considered as a limiting feature.

As stated above, the head bit segment can be loaded into the encoder twice, initially such that the encoder starts with a known state and at the end of the block transmission. Shifting in the "head" bits into the encoder at the end of the transmission resets the encoder for the error correction scheme providing a known output state at the end of the transmission. Thus, after finishing the encoding process (i.e. encoding the last bits of the message), the (K−1) initial bit segment stored in the register 106 can be shifted into the encoder 104 to bring the encoder 104 back to the state it started with in accordance with traditional forward error correction schemes. The disclosed embodiments for such a forward error correction arrangement can provide the same communication quality or communication performance as the current "tailbiting" schemes explained and defined by various standards.

It can be appreciated that using the first or head bit segment for forward error correction can greatly reduce the latency that traditionally occurs in tailbiting. Significant latency occurs in these traditional systems when decoding the data because a whole block of data (including the last bits or tail) must be serially clocked into a buffer before the encoding process can begin. When the head bits are utilized the encoder 104 can receive the head bits as part of the initial portion of the transmission and "immediately" generate an output because the system 100 does not have to wait for reception of the tail bits which creates latency or idle time Once the encoder 104 is loaded with the initial portion of the transmission the encoder output can immediately be fed to the power amp 108 for transmission. Thus, a transmission can occur immediately after the head bits or the first K-bits have entered the encoder 104. It can be appreciated that with the traditional tail (K−1) bits encoding approach, the size of memory required is dependant on the largest message block that needs to be encoded and the system of the present disclosure only requires a register 106 of minimal length, for example the size of the encoder 104.

In addition there is no requirement to clock the entire block of data to be transmitted into memory before the actual transmission is started. Thus, the traditional requirement for a relatively large register memory to store the entire length of message bits to receive the final (K−1) bits before initializing the encoder 104 can be eliminated. It can also be appreciated that when the first (K−1) bits are utilized to initialize the encoder 104 instead of the last (K−1) bits, the encoder 104 does not have to wait until the entire block of data is received by the memory before it starts encoding.

In one example, an 8-state encoder is utilized for encoding purposes and a block of data, a message or bit stream to be encoded can be [1 0 0 1 1 0 1 1 1 0 0 1 1 0]. The first 3 bits can indicate a start of the message that needs to be transmitted. The initial state for traditional tail-biting schemes would have been the last three bits or [1 1 0] (i.e. the last 3-bits [$2^3$=8 state encoder] of the message), and the initial state of the disclosed arrangements would be [1 0 0], the first three bits. The following table illustrates the state transitions:

| Latency measured in number of clocks | Input message bits for encoding | Tail biting "State of the encoder" | Head biting "State of the encoder" | |
|---|---|---|---|---|
| 1 | 1 | | | |
| 2 | 0 | | | |
| 3 | 0 | | 001 (Init State) | |
| 4 | 1 | | 100 | |
| 5 | 1 | | 110 | |
| 6 | 0 | | 011 | |
| 7 | 1 | | 101 | |
| 8 | 1 | | 110 | |
| 9 | 1 | | 111 | |
| 10 | 0 | | 011 | |
| 11 | 0 | | 001 | |
| 12 | 1 | | 100 | |
| 13 | 1 | | 110 | |
| 14 | 0 | 011 | 011 | |
| 15 | 1 | 101 | 101 | 1 |
| 16 | 0 | 010 | 010 | 0 |
| 17 | 0 | 001 | 001 (Final State) | 0 |
| 18 | 1 | 100 | | |
| 19 | 1 | 110 | | |
| 20 | 0 | 011 | | |
| 21 | 1 | 101 | | |
| 22 | 1 | 110 | | |
| 23 | 1 | 111 | | |
| 24 | 0 | 011 | | |
| 25 | 0 | 001 | | |
| 26 | 1 | 100 | | |
| 27 | 1 | 110 | | |
| 28 | 0 | 011 | | |

From the above table, it can be appreciated that a traditional tail-biting scheme takes 14+14=28 clock cycles to finish encoding where as the disclosed headbiting arrangement takes only 14+3=17 clock cycles which is less than half the clock cycles, a significant improvement in latency. In addition, the illustration in the table above has a message length that is much smaller than typical messages. Also, it can be appreciated that memory would be required to store the 14 message bits in the traditional tail-biting scheme and this memory must be filled before the system 100 can even transmit the first bit. When the disclosed system 100 processes and transmits the message in above table the register only needs to be three bits long or three bits in size.

Generally, if the length of message bits is 'M' and if 'K' corresponds to 2K state encoder then the total number of clock cycles needed for the traditional scheme (as in IEEE 802.16e - WiMax mobile standard) would be (M +M) clocks where as the proposed scheme will take only M+K cycles. Total latency in the traditional scheme is M cycles (where M could vary from block to block) where as in the disclosed headbiting arrangements it is always K-cycles (which can be fixed for a 2K state encoder). It can also be appreciated that in all practical systems K << M i.e. K is much smaller than M (a typical scenario is K=6 and M =288). A more realistic computation is when K =6 and M=288, thus in the current scheme 576 clocks are required for encoding and 288-bits storage are required where in the disclosed scheme 294 clocks cycles are required for encoding and 6-bits storage.

The disclosed headbiting arrangements can be integrated with the institute of electrical and electronic engineers (IEEE) specification 802.16 for WiMax and for other tail-biting encoding standards. It is anticipated that the disclosed arrangements will not create a change for bit-error-rates or packet-error-rates in encoded transmissions.

In another example, a long stream of bits with a long stream of zeros followed by (K−1) bits with zeros and ones interleaved (like 10010 or all ones 111111 for (K−1)=6 can be sent to encoder 104. With traditional tailbiting, the state is typically initialized with non-zero values and the encoder starts there-by producing toggling bits for 2*(K−1) output bits, for a rate-½ encoder before starting to output zeros until the output reaches the final (K−1) non-zero bits. With the disclosed headbiting arrangements the system could receive zeros all the way until the final (K−1) bits followed by pumping in the first (K−1) bits (which are zeros in this case). Clearly if the stream is abnormally long, the system can quickly detect which method of encoding is applied.

Figure 2:
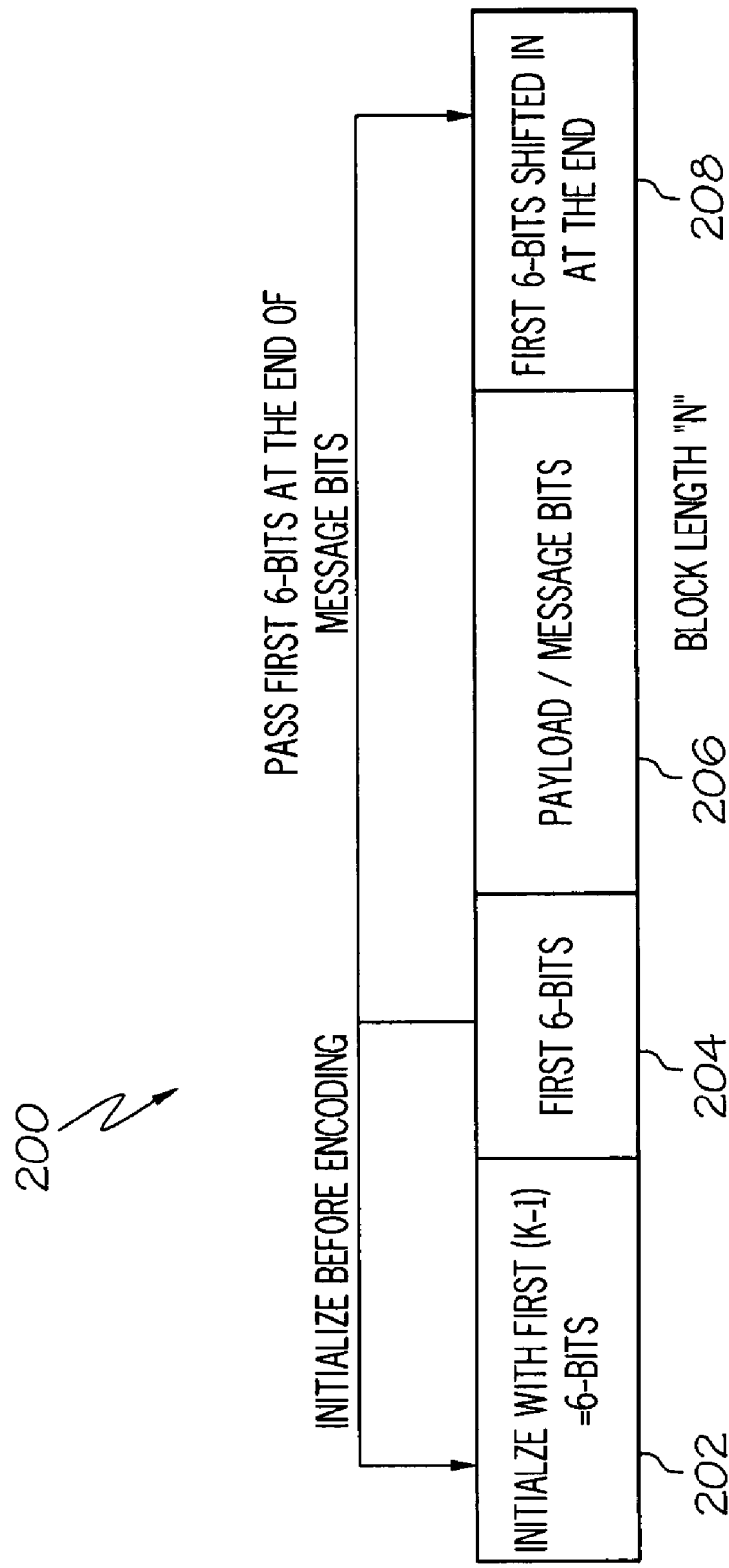
FIG. 2 illustrates an organization for a block of data.

Referring to FIG. 2 a stream of bits 200 is illustrated. The steam of bits 200 can be a block of length N. In the illustrated example the stream of bits 200 can include an initial segment of bits 202 a second occurrence of the initial segment of bits 204. The initial segment 202 which is registered version of first six bits 204 can be used for initialization before the encoding occurs. Next the bit stream can include a payload or message bits 206. After the payload 206 the first six bits can be shifted into the encoder as illustrated by placing the first six head bits or the initial bits received at the end of the transmission as illustrated by last bits 208, which can be done by shifting initial bits out of the registered version.

Figure 3:
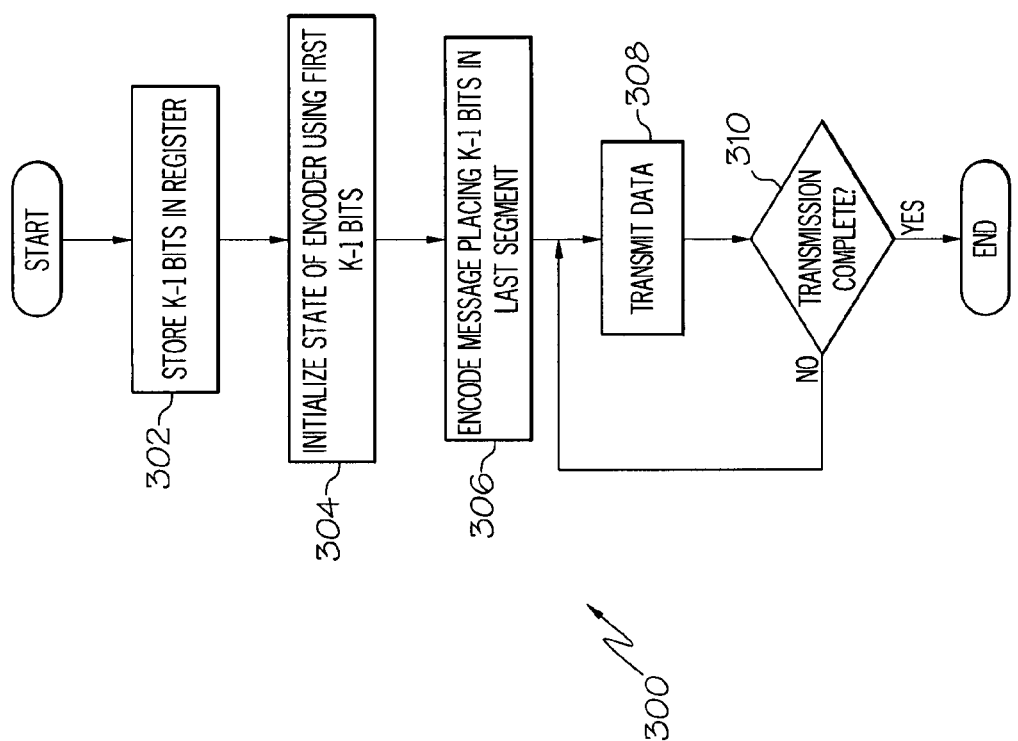
FIG. 3 illustrates a flow diagram of a method for transmitting data.

Referring to FIG. 3, a flow diagram for a method for encoding a bit stream is disclosed. Initially, as illustrated by block 302 K−1 bits can be received from a data source and the bits can be stored in a register. As illustrated by block 304, the state of an encoder is initialized by loading the initial bit segment or first (K−1) bits. The message starting from $K^{th}$ bit to the end of the message appended with the stored (K−1) bits in block 302 can be encoded—resulting in ending state same as the stating state which is the initial (K−1) bits. The encoded bits can then be transmitted as illustrated in block 308. The encoding and transmitting in block 306 and 308 can occur concurrently.

At decision block 310 it can be determined if the bit stream has ended or the transmission is complete. If the transmission is not complete then the system can continue to transmit data as illustrated in block 308. If the transmission is complete then the process can end thereafter.

Each process disclosed herein can be implemented with a software program. The software programs described herein may be operated on any type of computer, such as personal computer, server, etc. Any programs may be contained on a variety of signal-bearing media. Illustrative signal-bearing media include, but are not limited to: (i) information permanently stored on non-writable storage media (e.g., read-only memory devices within a computer such as CD-ROM disks readable by a CD-ROM drive); (ii) alterable information stored on writable storage media (e.g., floppy disks within a diskette drive or hard-disk drive); and (iii) information conveyed to a computer by a communications medium, such as through a computer or telephone network, including wireless communications. The latter embodiment specifically includes information downloaded from the Internet, intranet or other networks. Such signal-bearing media, when carrying computer-readable instructions that direct the functions of the described arrangements, represent embodiments of the present disclosure.

The disclosed embodiments can take the form of an entirely hardware embodiment, an entirely software embodiment or an embodiment containing both hardware and software elements. In one embodiment, the arrangements can be implemented in software, which includes but is not limited to firmware, resident software, microcode, etc. Furthermore, the arrangements can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The control module can retrieve instructions from an electronic storage medium. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD. A data processing system suitable for storing and/or executing program code can include at least one processor, logic, or a state machine coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

It will be apparent to those skilled in the art having the benefit of this disclosure that the present disclosure contemplates methods, systems, and media that can automatically tune a transmission line. It is understood that the form of the disclosure shown and described in the detailed description and the drawings are to be taken merely as examples. It is intended that the following claims be interpreted broadly to embrace all the variations of the example embodiments disclosed.

What is claimed is:

1. A method for encoding data comprising:
   receiving a first bit segment from a bit stream, the bit stream forming a block of data;
   storing the first bit segment;
   loading an encoder with the first bit segment;
   encoding data appended with the first bit segment;
   amplifying and transmitting the bit stream via a power amplifier; and
   reloading the encoder with the first bit segment as part of transmitting the block of data.

2. The method of claim 1, further comprising transmitting the first bit segment.

3. The method of claim 2, wherein the first bit segment is transmitted as part of a last portion of the transmitting the block of data.

4. The method of claim 1, further comprising quantizing received channel symbols of the transmitted data.

5. The method of claim 1, further comprising performing convolution encoding on the block of data.

6. The method of claim 1, further comprising performing viterbi decoding on the block of data.

7. The method of claim 1, wherein the first bit segment is an initial bit segment of the block of data.

8. The method of claim 1, wherein the encoded data is transmitted wirelessly or over a wireless medium.

9. The method of claim 1, further comprising decoding a quantized channel symbol to recover binary data from the bit stream.

10. An apparatus comprising:
an encoder to receive a block of data from a data source, the block of data having a bit segment in a first portion of the block of data, the encoder to encode the block of data;
a register coupled to the encoder to store the bit segment;
a power amplifier to transmit the encoded data; and
a transmit module to transmit the encoded bit stream, wherein the bit segment is initially loaded into the encoder and the bit segment is loaded into the encoder subsequent to the block of data being transmitted as part of transmitting a single block of data.

11. The apparatus of claim 10, further comprising a decoder to decode the encoded block of data.

12. The apparatus of claim 11 wherein the decoder is a viterbi decoder.

13. The apparatus of claim 10 wherein the register is a shift register.

14. The apparatus of claim 10, wherein the encoder is a convolution encoder.

15. An apparatus comprising:
an encoder to receive a block of data from a data source, the block of data having a bit segment in a first portion of the block of data, the encoder to encode the block of data;
a register coupled to the encoder to store the bit segment, wherein the register is a shift register; and
a transmit module to transmit the encoded bit stream, wherein the bit segment is initially loaded into the encoder and the bit segment is loaded into the encoder subsequent to the block of data being transmitted as part of transmitting a single block of data.

16. The apparatus of claim 15, further comprising a decoder to decode the encoded block of data.

17. The apparatus of claim 16, wherein the decoder is a viterbi decoder.

18. The apparatus of claim 15, wherein the encoder is a convolution encoder.

* * * * *